(12) United States Patent
Liu et al.

(10) Patent No.: US 10,411,116 B2
(45) Date of Patent: Sep. 10, 2019

(54) SEMICONDUCTOR SUPER-JUNCTION POWER DEVICE AND MANUFACTURING METHOD THEREFOR

(71) Applicant: SUZHOU ORIENTAL SEMICONDUCTOR CO.,LTD, Jiangsu (CN)

(72) Inventors: Lei Liu, Jiangsu (CN); Yuanlin Yuan, Jiangsu (CN); Pengfei Wang, Jiangsu (CN); Wei Liu, Jiangsu (CN); Yi Gong, Jiangsu (CN)

(73) Assignee: SUZHOU ORIENTAL SEMICONDUCTOR CO., LTD. (CN)

( * ) Notice: Subject to any disclaimer, the term of this patent is extended or adjusted under 35 U.S.C. 154(b) by 49 days.

(21) Appl. No.: 15/532,530

(22) PCT Filed: Apr. 8, 2016

(86) PCT No.: PCT/CN2016/078831
§ 371 (c)(1),
(2) Date: Jun. 2, 2017

(87) PCT Pub. No.: WO2016/173394
PCT Pub. Date: Nov. 3, 2016

(65) Prior Publication Data
US 2018/0269311 A1 Sep. 20, 2018

(30) Foreign Application Priority Data

Apr. 30, 2015 (CN) .......................... 2015 1 0217569
Feb. 25, 2016 (CN) .......................... 2016 1 0104097

(51) Int. Cl.
*H01L 29/66* (2006.01)
*H01L 29/78* (2006.01)
*H01L 29/06* (2006.01)
*H01L 29/10* (2006.01)

(52) U.S. Cl.
CPC .... *H01L 29/66712* (2013.01); *H01L 29/0615* (2013.01); *H01L 29/0619* (2013.01);
(Continued)

(58) Field of Classification Search
None
See application file for complete search history.

(56) References Cited

U.S. PATENT DOCUMENTS

2011/0227147 A1* 9/2011 Li ...................... H01L 29/0634
257/329
2012/0068298 A1 3/2012 Miyajima
(Continued)

FOREIGN PATENT DOCUMENTS

CN 102169902 A 8/2011
CN 102969356 A 3/2013
(Continued)

OTHER PUBLICATIONS

Patent Cooperation Treaty (PCT), International Search Report for Application PCT/CN2016/078831 filed Apr. 8, 2016, dated Jul. 4, 2016, International Searching Authority, CN.

*Primary Examiner* — Calvin Y Choi
(74) *Attorney, Agent, or Firm* — McDonald Hopkins LLC

(57) ABSTRACT

The present disclosure relates to the technical field of semiconductor power devices, and in particular relates to a semiconductor super-junction power device and a manufacturing method therefor. The super-junction power device of the present disclosure includes a termination region and a cell region; the cell region includes a substrate epitaxial layer and a drain region at a bottom of the substrate epitaxial layer, the substrate epitaxial layer has a plurality of pillar epitaxial doped regions and a plurality of JFET regions, a body region is arranged at a top of each of the plurality of pillar epitaxial doped regions; the body regions have at least two unequal widths; two source regions are arranged in each (Continued)

of the body regions; a gate oxide layer is arranged on the body regions and the JFET regions; and a gate is arranged on the gate oxide layer.

17 Claims, 5 Drawing Sheets

(52) U.S. Cl.
CPC ...... *H01L 29/0634* (2013.01); *H01L 29/0638* (2013.01); *H01L 29/1095* (2013.01); *H01L 29/7802* (2013.01); *H01L 29/7811* (2013.01)

(56) References Cited

U.S. PATENT DOCUMENTS

| | | | | |
|---|---|---|---|---|
| 2013/0146971 | A1* | 6/2013 | Hirler | H01L 27/0248 257/334 |
| 2014/0151804 | A1* | 6/2014 | Meiser | H01L 29/66795 257/347 |
| 2015/0076600 | A1* | 3/2015 | Jun | H01L 21/265 257/339 |

FOREIGN PATENT DOCUMENTS

| | | |
|---|---|---|
| CN | 104952928 A | 9/2015 |
| JP | 2003124465 A | 4/2003 |
| JP | 2003243653 A | 8/2003 |
| JP | 2007059636 A | 3/2007 |
| JP | 2011228611 A | 11/2011 |
| JP | 2012174949 A | 9/2012 |
| JP | 2014063907 A | 4/2014 |
| JP | 2015046627 A | 3/2015 |

* cited by examiner

SEMICONDUCTOR SUPER-JUNCTION POWER DEVICE AND MANUFACTURING METHOD THEREFOR

CROSS-REFERENCE TO RELATED APPLICATION

This application is a 35 U.S.C. 371 national stage filing of PCT Application No. PCT/CN2016/078831, filed on Apr. 8, 2016, which claims priority to Chinese Patent Application No. 201610104097.X, filed on Feb. 25, 2016 and Chinese Application No. 201510217569.8, filed on Apr. 30, 2015 each of which are incorporated herein in their entirety by reference.

TECHNICAL FIELD

The present disclosure relates to the technical field of semiconductor power devices, and in particular relates to a semiconductor super-junction power device and a manufacturing method therefor.

BACKGROUND

A super-junction power device is based on a charge balance technology and can reduce on-resistance and parasitic capacitance, so that the super-junction power device has extremely fast switching characteristic, can reduce switching loss and can realize higher power conversion efficiency. As shown in FIG. 1, a well-known super-junction power device includes a cell region for obtaining low on-resistance and a termination region for increasing the withstand voltage of cells at an outermost edge of the cell region. According to specific requirements for a product, the termination region has different quantities of pillar epitaxial doped regions 102 so as to mainly meet withstand voltage requirements of different products. The cell region includes a drain region 100 of a substrate epitaxial layer 101 and a plurality of pillar epitaxial doped regions 102 configured to form a charge balance with impurities of the substrate epitaxial layer 101, and the width of each of the pillar epitaxial doped regions 102 is equal to an interval between adjacent pillar epitaxial doped regions, so as to realize the charge balance; a body region 103 is arranged at the top of each of the pillar epitaxial doped regions 102, and each body region 103 exceeds the two sides of the corresponding pillar epitaxial doped region 102 and extends into the substrate epitaxial layer 101; in each body region 103, the two sides thereof are respectively provided with a source region 106; and a gate oxide layer 104 and a gate 105 are arranged on the body regions 103 and the substrate epitaxial layer 101.

In a turn-on and turn-off process of the super-junction power device, a miller capacitance (Crss) and a gate-drain capacitance (Cgd) corresponding to the Crss play a leading role in the switching speed of the super-junction power device, and the switching speed of the super-junction power device can be improved and the switching loss can be reduced if the Cgd is reduced. Meanwhile, as shown in FIG. 2, the Cgd suddenly changes when the well-known super-junction power device is turned on and turned off, causing a serious oscillation in the voltage of the gate of the super-junction power device.

SUMMARY

The present disclosure aims at providing a semiconductor super-junction power device and a manufacturing method therefor so as to overcome the defects existed in the existing art. The super-junction power device of the present disclosure adopts a structure in which two or more body regions with different widths are included, so that the speed of the sudden-change of Cgd is reduced when the super-junction power device is turned on or turned off. Therefore, the oscillation of the voltage of the gate of the super-junction power device is reduced.

The semiconductor super-junction power device proposed by the present disclosure includes a termination region and a cell region. The cell region includes a substrate epitaxial layer and a drain region at a bottom of the substrate epitaxial layer, the substrate epitaxial layer has a plurality of pillar epitaxial doped regions and a plurality of Junction Field-effect Transistor (JFET) regions, a body region is arranged at a top of each of the plurality of pillar epitaxial doped regions. The body regions have at least two unequal widths, two source regions are arranged in each of the body regions. A gate oxide layer is arranged on the body regions and the JFET regions, and a gate is arranged on the gate oxide layer Junction The semiconductor super-junction power device proposed by the present disclosure has a further preferable solution as follows:

widths of the body regions of the present disclosure are sequentially set as: one of the following C, C+1D, C, C+1D, C . . . ; C, C+1D, . . . , C+nD, C+(n−1)D, . . . , C, C+1D, . . . , C+nD, C+(n−1)D, . . . , C, . . . ; C, C, . . . , C+1D, C+1D, . . . , C+nD, C+nD, . . . , C+(n−1)D, C+(n−1)D, . . . , C, C, . . . , where C is a reference width of the body regions, D is a variation relative to the reference width, and n is an integer greater than or equal to 2.

The interval between adjacent columnar epitaxial doped regions in the plurality of columnar epitaxial doped regions has at least two unequal widths, and the interval between adjacent columnar epitaxial doped regions can be sequentially set as one of the following: A, A+1B, A, A+1B, A, . . . ; A, A+1B, . . . , A+nB, A+(n−1)B, . . . , A, A+1B, . . . , A+nB, A+(n−1)B, . . . , A, . . . ; A, A, . . . , A+1B, A+1B, . . . , A+nB, A+nB, . . . , A+(n−1)B, A+(n−1)B, . . . , A, A, . . . , where A is a reference interval, B is a variation relative to the reference interval, and n is an integer greater than or equal to 2.

The width of each of the plurality of columnar epitaxial doped regions of the present disclosure is equal to each other, and an interval between adjacent columnar epitaxial doped regions is equal to each other.

The interval between adjacent columnar epitaxial doped regions in the plurality of columnar epitaxial doped regions has at least two unequal widths, and the interval between adjacent columnar epitaxial doped regions can be sequentially set as one of the followings: A, A+1B, A, A+1B, A, . . . ; A, A+1B, . . . , A+nB, A+(n−1)B, . . . , A, A+1B, . . . , A+nB, A+(n−1)B, . . . , A, . . . ; A, A, . . . , A+1B, A+1B, . . . , A+nB, A+nB, . . . , A+(n−1)B, A+(n−1)B, . . . , A, A, . . . , where A is a reference interval, B is a variation relative to the reference interval, and n is an integer greater than or equal to 2.

The semiconductor super-junction power device proposed by the present disclosure further includes a current channel region formed in the body regions between the source regions and the JFET regions. The gate of the present disclosure may be an integrated gate covering the current channel region and the JFET region or may be a split gate covering and exceeding the channel region and being split on the JFET regions.

A field oxide layer is arranged between the gate and the gate oxide layer on the JFET regions, and the thickness of each of the field oxide layers is 2-10 times of that of the gate oxide layer.

The substrate epitaxial layer, the drain region and the source regions of the present disclosure respectively have a first doping type, and the columnar epitaxial doped regions and the body regions respectively have a second doping type, where the first doping type is n-type doping, and the second doping type is p-type doping; or, the first doping type is p-type doping, and the second doping type is n-type doping.

A gate resistor is arranged on the body regions and the substrate epitaxial layer of the present disclosure, a dielectric layer is arranged between the gate resistor and the body regions and between the gate resistor and the substrate epitaxial layer, and the gate is connected with an external circuit by the gate resistor.

A manufacturing method of the semiconductor super-junction power device proposed by the present disclosure includes the following basic steps:

in step 1, etching a substrate epitaxial layer of a first doping type to form a plurality of pillar epitaxial doped regions of a second doping type, the plurality of pillar epitaxial doped regions are sunken in the substrate epitaxial layer and configured to form a charge balance with impurities of the substrate epitaxial layer;

in step 2, forming body regions of a second doping type, the body regions have two or more unequal widths, and each of the body regions is formed at a top of each of the plurality of pillar epitaxial doped regions, and exceeds two sides of a corresponding pillar epitaxial doped region and extends into the substrate epitaxial layer;

in step 3, forming a gate oxide layer on the body regions and the substrate epitaxial layer, and forming a polycrystalline silicon dielectric layer on the gate oxide layer;

in step 4, etching the polycrystalline silicon dielectric layer and the gate oxide layer, and forming a gate with the polycrystalline silicon dielectric layers remained after etching;

in step 5, performing source region photoetching, and then injecting irons of the first doping type, so as to form two source regions in each of the body regions;

in step 6, depositing an insulation dielectric layer, etching the insulation dielectric layer to form contact holes, and then depositing a metal layer and etching the metal layer to form an electrode contact body of the source regions and an electrode contact body of the gate; and in step 7, forming a drain region of the first doping type in the substrate epitaxial layer, and depositing a metal layer to form an electrode contact body of the drain region The manufacturing method of the semiconductor super-junction power device proposed by the present disclosure has a further preferable solution as follows:

An interval with at least two unequal widths is set between adjacent pillar epitaxial doped regions in step 1.

The gate oxide layer in step 3 is made from at least one of silicon oxide, silicon nitride, silicon oxynitride, hafnium oxide and other insulation materials with a high dielectric constant.

A gate resistor on the body regions and the substrate epitaxial layer is further formed when etching the polycrystalline silicon dielectric layer and forming the gate in step 4.

Irons of the first doping type are injected at a low concentration in a self-aligning manner before the source region photoetching in step 5.

Compared with the existing art, the present disclosure has significant advantages as follows:

Firstly, a structure having body regions with two or more different widths are adopted in the cell region of the semiconductor super-junction power device of the present disclosure, so that the sudden-change speed of the Cgd is reduced when the super-junction power device is turned on or turned off, thereby reducing the oscillation of the voltage of the gate of the super-junction power device;

Secondly, the semiconductor super-junction power device of the present disclosure also adopts a synergistic effect of the columnar epitaxial doped region structures with unequal intervals and the structure having body regions with different widths, so that more slow changes can be led in the super-junction power device; therefore, the sudden change of the Cgd becomes more smooth, so as to further reduce the oscillation of the voltage of the gates; and Thirdly, according to the semiconductor super-junction power device of the present disclosure, the gate resistor can be conveniently integrated in a chip, so as to further suppress the oscillation of the voltage of the gates.

DETAILED DESCRIPTION

Figure 1:
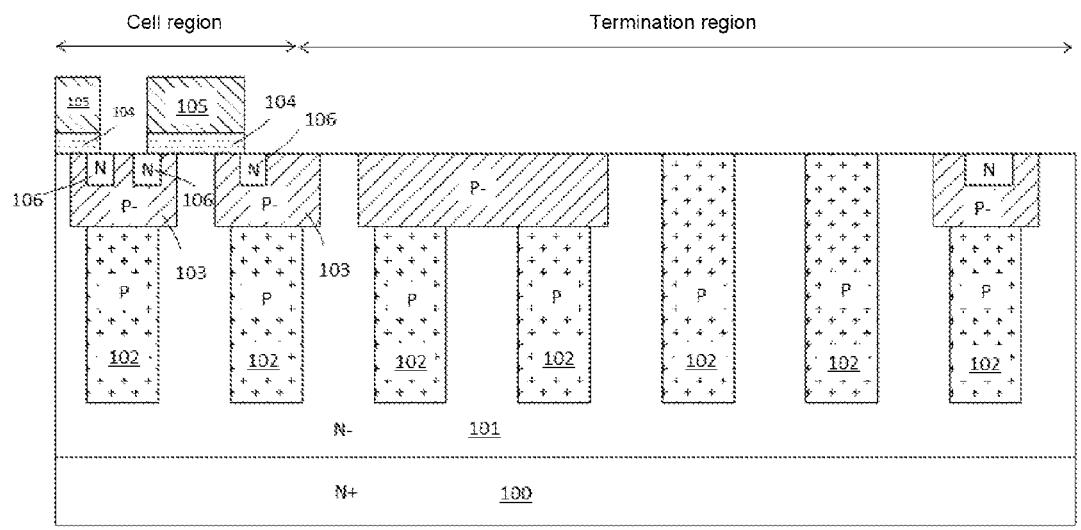
FIG. 1 is a schematic diagram illustrating a sectional structure of a well-known semiconductor super-junction power device.
Figure 2:
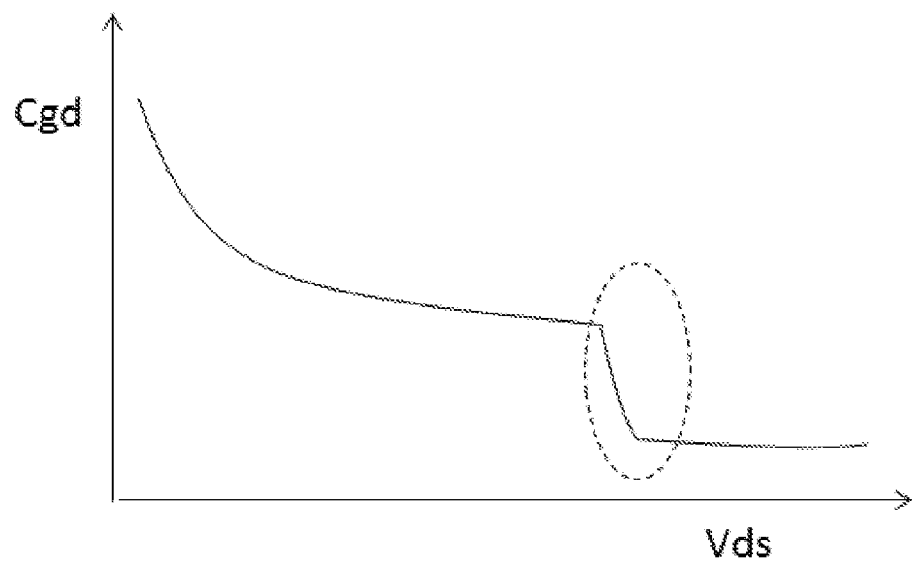
FIG. 2 is a schematic diagram illustrating a changing curve of a gate-drain capacitance (Cgd) when a well-known semiconductor super-junction power device is turned on and turned off.

The specific implementation manners of the present disclosure are further described below in detail in combination with drawings and embodiments.

In order that the specific implementation manners of the present disclosure can be described clearly, the thicknesses of layers and regions described in the present disclosure are enlarged in schematic diagrams listed in the drawings of the specification, and the sizes of listed graphics do not represent actual sizes; and the drawings of the specification are schematic and should not limit the scope of the present disclosure. Embodiments listed in the specification should not be limited to specific shapes of the regions shown in the drawings of the specification and include shapes obtained, such as deviation caused by manufacture and the like; and for example, curves obtained by etching often have the feature of curving or rounding, which are expressed by rectangles in embodiments of the present disclosure.

A semiconductor super-junction power device of the present disclosure includes a cell region and a termination region. The cell region is configured to obtain a low on-resistance, and the termination region is configured to increase the withstand voltage of cells at an outermost edge of the cell region. The termination region adopts a general structure of the existing semiconductor super-junction power device and has different design structures according to the requirements of different products, and the specific structures of the termination region of the semiconductor super-junction power device are not shown and described in embodiments of the present disclosure.

Figure 3:
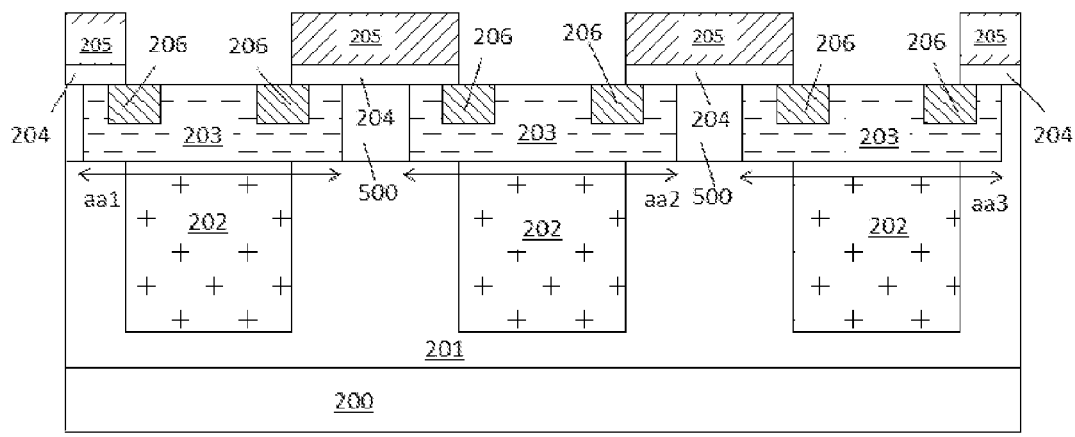
FIG. 3 is a schematic diagram illustrating a sectional structure of a semiconductor super-junction power device according to embodiment I of the present disclosure.

FIG. 3 is a schematic diagram illustrating a sectional structure of a semiconductor super-junction power device according to embodiment I of the present disclosure, and FIG. 3 shows a sectional structure of the cell region of the semiconductor super-junction power device of the present disclosure. The cell region of the semiconductor super-junction power device of the present disclosure includes: a substrate epitaxial layer 201 of a first doping type and a drain region 200 of a first doping type at the bottom of the substrate epitaxial layer 201. The substrate epitaxial layer 201 is preferably made from silicon, but is not limited to silicon. A plurality of pillar epitaxial doped regions 202 of a second doping type are provided in the substrate epitaxial layer 201. The plurality of pillar epitaxial doped regions 202 are sunken in the substrate epitaxial layer 201 and configured to form a charge balance with impurities of the substrate epitaxial layer 201. Only three pillar epitaxial doped regions 202 are shown in embodiment I, and the number of the pillar epitaxial doped regions 202 may be determined according to design requirements of products. Preferably, the widths of the pillar epitaxial doped regions 202 are equal to each other, and the intervals between adjacent pillar epitaxial doped regions 202 are equal to each other, so as to realize the charge balance.

A body region 203 of a second doping type is provided at the top of each pillar epitaxial doped region 202, and each body region 203 exceeds two sides of the corresponding pillar epitaxial doped region 202 and extends into the substrate epitaxial layer 201. The body regions 203 of the present disclosure have two or more different widths. As exemplarily shown in embodiment I, the body regions have three different widths: aa1, aa2 and aa3. Preferably, a width combination of the body regions 203 of the present disclosure may be sequentially set as: C, C+1D, C, C+1D, C, . . . ; or be sequentially set as: C, C+1D, . . . , C+nD, C+(n−1)D, . . . , C, C+1D, . . . , C+nD, C+(n−1)D, . . . , C, . . . ; or be sequentially set as: C, C+1D, C+1D, . . . , C+nD, C+nD, . . . , C+(n−1)D, C+(n−1)D, . . . , C, C, . . . , where n is greater than or equal to 2; C represents a basic width of the body region; and D represents a changed width of the body region, and the specific values of n, C and D are determined according to the design requirements of the products. The structure having body regions with different widths can reduce the sudden-change speed of Cgd when the super-junction power device is turned on and turned off.

A part of the substrate epitaxial layer, which is located between adjacent body regions 203, is a JFET region 500 of the device. The JFET regions 500 are parasitic junction field-effect transistor regions in the super-junction power device.

Two source regions 206 of the first doping type is are provided in each of the body regions 203, a gate oxide layer 204 is further arranged on each of the body regions 203 and the JFET regions, and a gate 205 is provided on each of the gate oxide layers 204. In the present embodiment, the gate completely cover the gate oxide layer 204 on the JFET region 500, and is a gate with an integrated gate structure.

In the semiconductor super-junction power device of the present disclosure, the gates are isolated by an insulation dielectric layer. The insulation dielectric layer is further formed with a contact hole filled with a metal layer. The metal layer should cover the gates and form Ohmic contact with the body regions 203 and the source regions 206 simultaneously. All the common structures in the existing art are not shown and described in detail in embodiments of the present disclosure.

The first doping type and the second doping type described in the present disclosure are opposite doping types, namely, the second doping type is p-type doping if the first doping type is n-type doping; and the second doping type is n-type doping if the first doping type is p-type doping.

Figure 4:
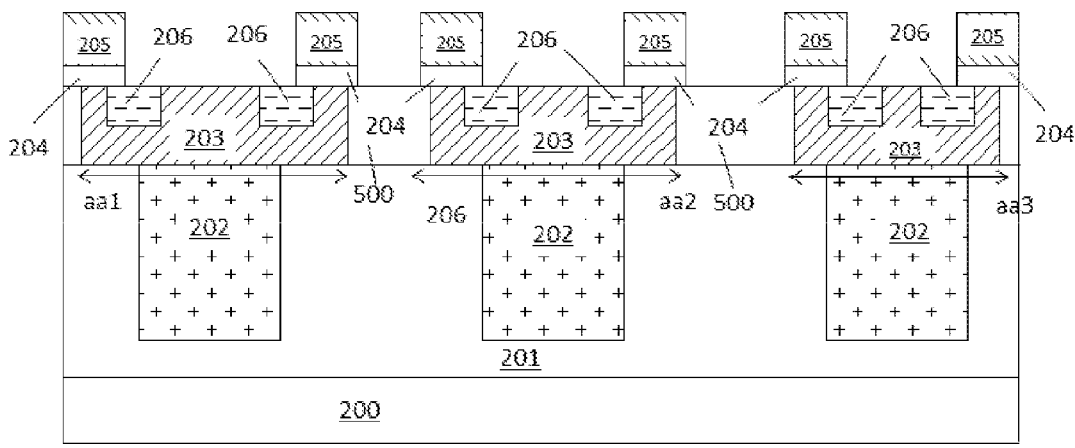
FIG. 4 is a schematic diagram illustrating a sectional structure of a semiconductor super-junction power device according to embodiment II of the present disclosure.

FIG. 4 is a schematic diagram illustrating a sectional structure of a semiconductor super-junction power device proposed by embodiment II of the present disclosure. Compared with the semiconductor super-junction power device shown in FIG. 3, in the semiconductor super-junction power device of embodiment II, the gates 205 cover current channel regions (the current channel regions are inversion layers formed in the body regions when the device works, which are not shown in FIG. 4) and exceed the current channel regions to ensure full coverage on the current channel regions. Each gate 205 is split on the JFET regions 500 to form a gate 205 with a split gate structure which may reduce the gate-drain capacitance Cgd, so as to reduce the sudden change of the gate-drain capacitance Cgd when the device is turned on or turned off.

Figure 5:
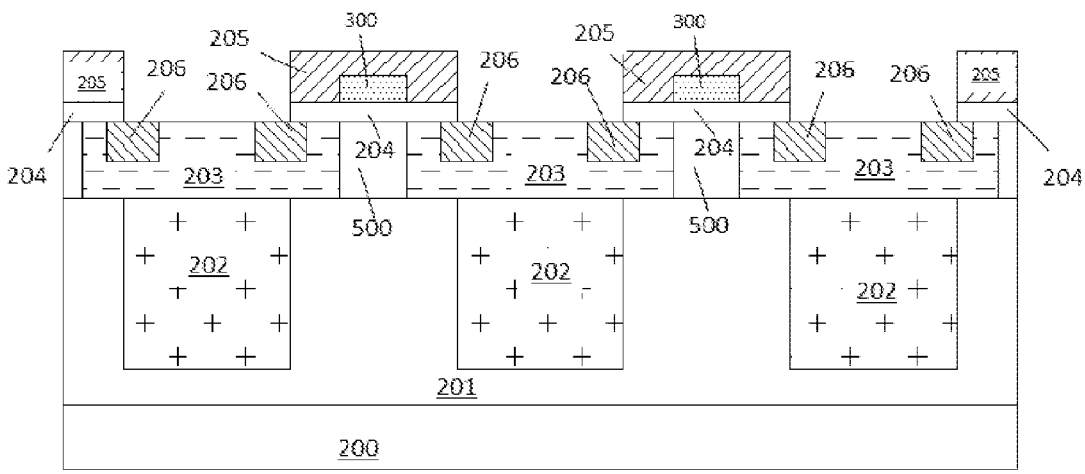
FIG. 5 is a schematic diagram illustrating a sectional structure of a semiconductor super-junction power device according to embodiment III of the present disclosure.

FIG. 5 is a schematic diagram illustrating a sectional structure of a semiconductor super-junction power device proposed by embodiment III of the present disclosure. Compared with the semiconductor super-junction power device shown in FIG. 3, in the semiconductor super-junction power device of embodiment III, a field oxide layer 300 located between the gate 205 and the gate oxide layer 204 is provided above each of the JFET region 500 so as to reduce the gate-drain capacitance Cgd, thereby reducing the sudden change of the gate-drain capacitance Cgd when the device is turned on or turned off. Preferably, the thickness of the field oxide layer 300 is 2~10 times of that of the gate oxide layer 204.

Figure 6:
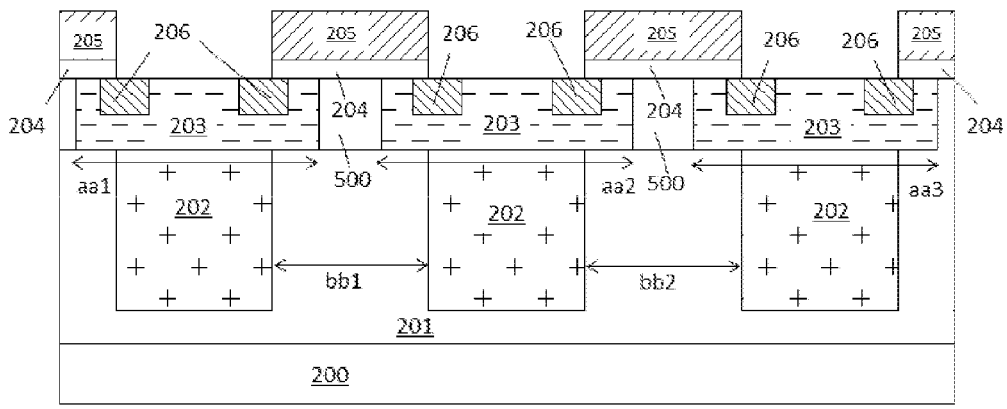
FIG. 6 is a schematic diagram illustrating a sectional structure of a semiconductor super-junction power device according to embodiment IV of the present disclosure.

FIG. 6 is a schematic diagram illustrating a sectional structure of a semiconductor super-junction power device proposed by embodiment IV of the present disclosure. Compared with the semiconductor super-junction power device shown in FIG. 3, in the semiconductor super-junction power device of embodiment IV, the structure having body regions with different widths is adopted, and the adjacent pillar epitaxial doped regions 202 are arranged with two or more unequal intervals. In embodiment IV, two different intervals bb1 and bb2 are shown. Preferably, the intervals between adjacent pillar epitaxial doped regions 202 can be sequentially set as: A, A+1B, A, A+1B, A, . . . ; or be sequentially set as: A, A+1B, . . . , A+nB, A+(n−1)B, . . . , A, A+1B, . . . , A+nB, A+(n−1)B, . . . , A, . . . ; or be sequentially set as: A, A, . . . , A+1B, A+1B, . . . , A+nB, A+nB, . . . , A+(n−1)B, A+(n−1)B, . . . , A, A, . . . , where n is greater than or equal to 2; A represents the size of a basis interval between adjacent pillar epitaxial doped regions; and B represents the size of a changed interval between adjacent pillar epitaxial doped regions, and the specific values of n, A and B are determined according to the design requirements of products.

Figure 7:
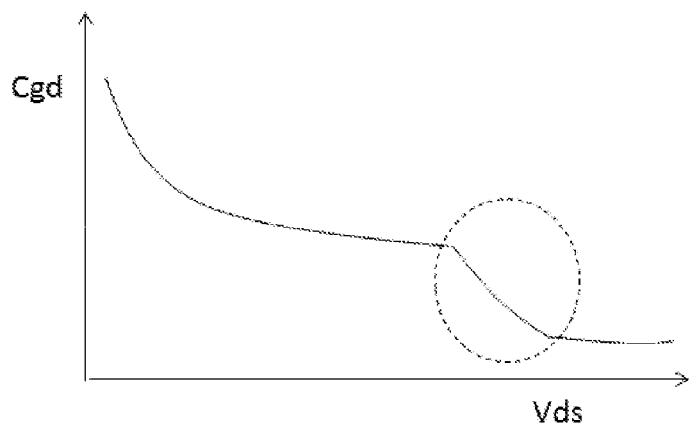
FIG. 7 is a schematic diagram illustrating a changing curve of a gate-drain capacitance (Cgd) when a semiconductor super-junction power device of the present disclosure is turned on and turned off.

FIG. 7 is a schematic diagram illustrating a changing curve of the gate-drain capacitance Cgd when a semiconductor super-junction power device of the present disclosure is turned on or turned off. As can be seen from FIG. 7, the sudden-change speed of the gate-drain capacitance Cgd is reduced when the semiconductor super-junction power device of the present disclosure is turned on or turned off, so as to reduce the oscillation of the voltage of gates caused by the sudden change of the gate-drain capacitance Cgd.

Figure 8:
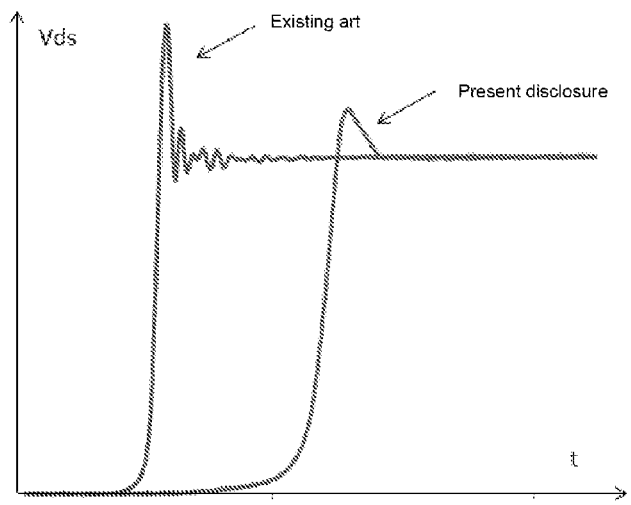
FIG. 8 is a schematic diagram illustrating comparison of switching waveforms of a semiconductor super-junction power device of the present disclosure and a semiconductor super-junction power device of the existing art.

FIG. 8 is a schematic diagram illustrating comparison of switching waveforms of a semiconductor super-junction power device of the present disclosure and a semiconductor super-junction power device of the existing art. As can be seen from FIG. 8, the Vds overshoot is obviously reduced when the semiconductor super-junction power device of the present disclosure is turned on or turned off.

FIGS. 9-12 are schematic diagrams illustrating a process flow of an embodiment of a manufacturing method of a semiconductor super-junction power device of the present disclosure. Specifically, a manufacturing method of the super junction power device shown in embodiment II is taken as an example.

Figure 9:
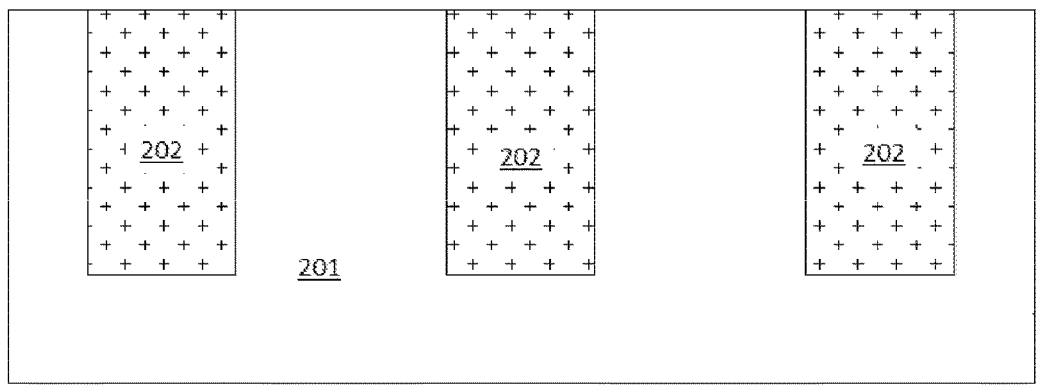
FIGS. 9-12 are schematic diagrams illustrating a process flow of an embodiment of a manufacturing method of a semiconductor super-junction power device of the present disclosure.

Firstly, as shown in FIG. 9, a hard mask layer is deposited on the surface of the substrate epitaxial layer 201 of the first doping type; next, a plurality of hard mask layer openings are formed in the hard mask layer through photoetching and etching; then the substrate epitaxial layer 201 is etched by taking the hard mask layer as a mask to form a plurality of pillar grooves in the substrate epitaxial layer 201; an epitaxial layer of the second doping type is deposited after the hard mask layer being etched away, so that the pillar grooves are fully filled with the epitaxial layer of the second doping type; and finally, a planarization treatment is carried out to form a plurality of pillar epitaxial doped regions 202 of the second doping type in the substrate epitaxial layer 201, which are sunken in the substrate epitaxial layer 201 and configured to form a charge balance with impurities of the substrate epitaxial layer.

Figure 10:
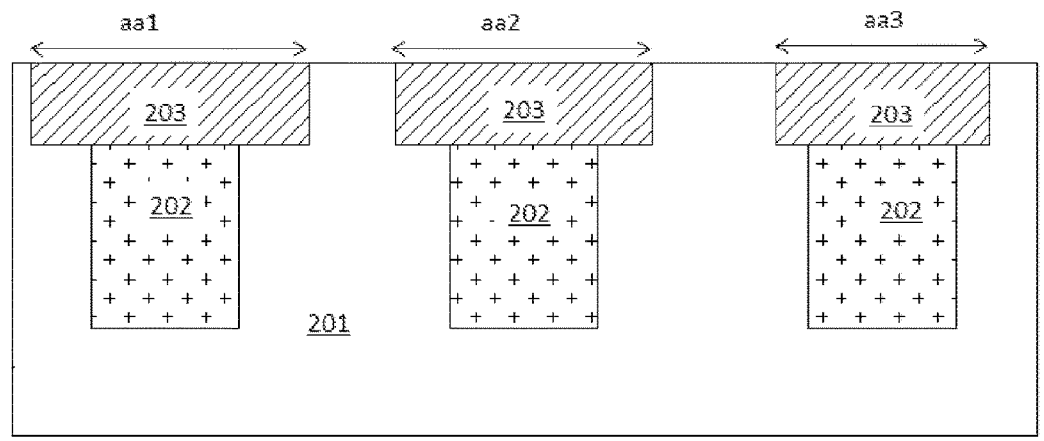

Next, as shown in FIG. 10, the positions of body regions are defined by a photolithography technique, then irons of the second doping type are injected, so that a body region 203 of the second doping type is formed at the top of each of the pillar epitaxial doped regions 202. The body region 203 exceeds the two sides of the corresponding pillar epitaxial doped region 202 and extends into the substrate epitaxial layer 201. As exemplarily shown in the present embodiment, the body regions 203 have three different widths: aa1, aa2 and aa3.

Figure 11:
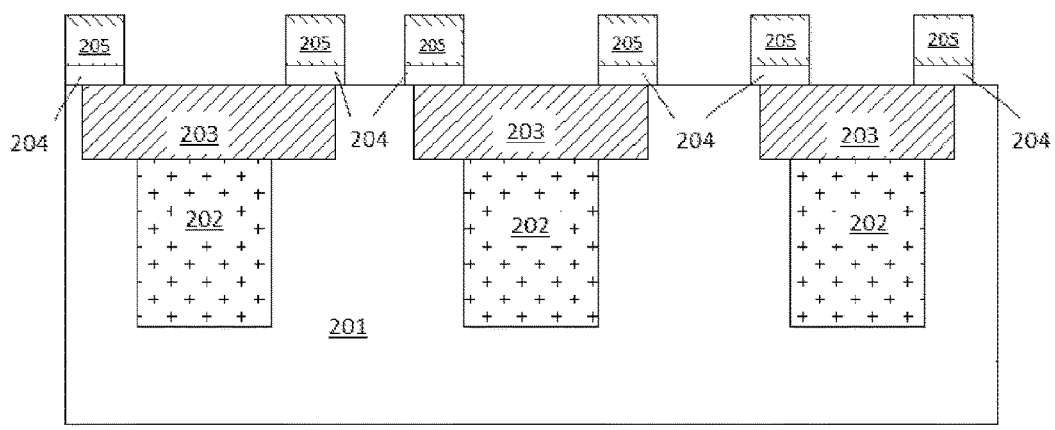

Next, as shown in FIG. 11, the gate oxide layer 204 is formed on the surface of the body region 203 and the substrate epitaxial layer 201, and a polycrystalline silicon dielectric layer is formed on the gate oxide layer 204; then, photoetching is carried out to define the positions of gates of the super-junction power device, then the polycrystalline silicon dielectric layers and the gate oxide layers 204 are etched, and the residual polycrystalline silicon dielectric layers after etching form gates 205 of the device, which are gates 205 in a split gate structure in the present embodiment; and the gate oxide layers 204 are made from silicon oxide, silicon nitride, silicon oxynitride, hafnium oxide or other insulation materials with a high dielectric constant.

Optionally, a gate resistor on the substrate epitaxial layer and the body region is formed by controlling the pattern of the photolithographic mask when the gate 205 is formed, and the gate resistor can be isolated from the body region and the substrate epitaxial layer by the gate oxide layer.

Figure 12:
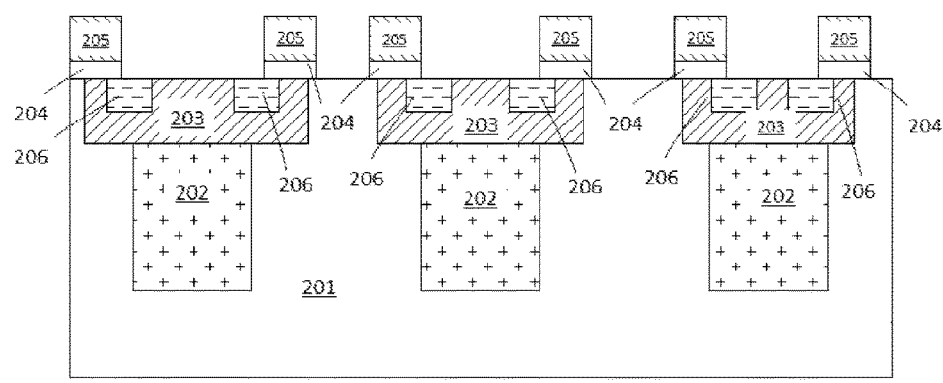

Next, as shown in FIG. 12, the positions of the source regions of the device are defined through source region etching, then irons of the first doping type are injected so as to form a source regions 206 of the device at two sides in each of the body regions 203. Preferably, before the source region 206 are formed, irons of the first doping type are injected at a low concentration in a self-aligning manner, so as to adjust the doping density of impurities on the surface of the substrate epitaxial layer 201 and to further suppress an effect of a parasitic JFET; and then the source region etching and irons injection are performed.

Finally, an insulation dielectric layer is deposited, and the insulation dielectric layer may be made from silica glass, boron-phosphorosilicate glass or phosphorosilicate glass; next, the position of the contact hole is defined through photoetching, and then the insulation dielectric layer is etched to form the contact hole in the insulation dielectric layer; next, irons of the second doping type are injected so as to form a contact region of the body regions in the body regions, the contact region of the body regions has structures well known in the industry and is configured to reduce the contact resistance in the Ohmic contact formed subsequently; then, a metal layer is deposited, the metal layer forms the Ohmic contact with the body regions and the source regions in the contact hole simultaneously, and the metal layer is etched to form an electrode contact body of the source regions and an electrode contact body of the gates; and finally, a drain region of the first doping type is formed in the substrate epitaxial layer, and a metal layer is deposited to form an electrode contact body of the drain region. The above processes are well known in the industry and are not described in detail in embodiments of the present disclosure.

All descriptions not involved in the specific implementation manners of the present disclosure belong to common technologies of the field and can be implemented with reference to the common technologies.

The above specific implementation manners and embodiments are specific support for technological concepts of the semiconductor super-junction power device and the manufacturing method therefor proposed by the present disclosure and cannot be used for limiting the protection scope of the present disclosure. Any equivalent change or equivalent modification made on a basis of the technical solution according to the technological concepts proposed by the present disclosure still belongs to the protection scope of the technical solution of the present disclosure.

What is claimed is:

1. A semiconductor super-junction power device, comprising a termination region and a cell region, the cell region comprises a substrate epitaxial layer and a drain region at a bottom of the substrate epitaxial layer, wherein a plurality of pillar epitaxial doped regions, a plurality of Junction Field-effect Transistor (JFET) regions and a plurality of body regions are disposed in the substrate epitaxial layer, wherein each of the body regions is arranged at a top of a respective one of the plurality of pillar epitaxial doped regions, and wherein the plurality of body regions included in the cell region have at least two unequal widths, two source regions are arranged in each of the body regions, a gate oxide layer is arranged on the body regions and the JFET regions, and a gate is arranged on the gate oxide layer.

2. The semiconductor super-junction power device according to claim 1, wherein widths of the body regions are sequentially set as one of the followings: C, C+1D, C, C+1D, C . . . ; C, C+1D, . . . , C+nD, C+(n−1)D, C, C+1D, . . . , C+nD, C+(n−1)D, . . . , C, . . . ; C, C+1D, C+1D, . . . , C+nD, C+nD, . . . , C+(n−1)D, C+(n−1)D, . . . , C, C, . . . , wherein C is a reference width of the body regions, D is a variation relative to the reference width, and n is an integer greater than or equal to 2.

3. The semiconductor super-junction power device according to claim 1, wherein each of the plurality of pillar epitaxial doped regions has a same width, and intervals between adjacent pillar epitaxial doped regions are equal to each other.

4. The semiconductor super-junction power device according to claim 1, wherein intervals between adjacent pillar epitaxial doped regions in the plurality of pillar epitaxial doped regions have at least two unequal widths.

5. The semiconductor super-junction power device according to claim 4, wherein the intervals between adjacent pillar epitaxial doped regions are sequentially set as one of the followings: A, A+1B, A, A+1B, A, . . . ; A, A+1B, . . . , A+nB, A+(n−1)B, . . . , A, A+1B, . . . , A+nB, A+(n−1)B, . . . , A, . . . ; A, A, . . . , A+1B, A+1B, . . . , A+nB, A+nB, . . . , A+(n−1)B, A+(n−1)B, . . . , A, A, . . . , wherein A is a reference interval, B is a variation relative to the reference interval, and n is an integer greater than or equal to 2.

6. The semiconductor super-junction power device according to claim 1, further comprising a current channel region formed in the body regions between the source regions and the JFET regions, wherein the gate is an integrated gate covering the current channel region and the JFET regions.

7. The semiconductor super-junction power device according to claim 1, further comprising a current channel region formed in the body regions between the source regions and the JFET regions, wherein the gate is a split gate covering and exceeding the current channel region and being split on the JFET regions.

8. The semiconductor super-junction power device according to claim 1, wherein a field oxide layer is arranged between the gate and the gate oxide layer on the JFET regions, and a thickness of the field oxide layer is 2-10 times of that of the gate oxide layer.

9. The semiconductor super-junction power device according to claim 1, wherein the substrate epitaxial layer, the drain region and the source regions are of a first doping type, and the pillar epitaxial doped regions and the body regions are of a second doping type.

10. The semiconductor super-junction power device according to claim 9, wherein the first doping type is n-type doping, and the second doping type is p-type doping.

11. The semiconductor super-junction power device according to claim 9, wherein the first doping type is p-type doping, and the second doping type is n-type doping.

12. The semiconductor super-junction power device according to claim 1, wherein a gate resistor is provided on the body regions and the substrate epitaxial layer, a dielectric layer is provided between the gate resistor and the body regions and between the gate resistor and the substrate epitaxial layer, and the gate is connected with an external circuit through the gate resistor.

13. A manufacturing method of a semiconductor super-junction power device, comprising the following basic steps:
    etching a substrate epitaxial layer of a first doping type to form a plurality of pillar epitaxial doped regions of a second doping type, wherein the plurality of pillar epitaxial doped regions are sunken in the substrate epitaxial layer and configured to form a charge balance with impurities of the substrate epitaxial layer;
    forming a plurality of body regions of a second doping type, wherein the plurality of body regions have two or more unequal widths, and each of the body regions is formed at a top of a respective one of the plurality of pillar epitaxial doped regions, and exceeds two sides of the respective one of the plurality of pillar epitaxial doped regions and extends into the substrate epitaxial layer, and the plurality of body regions having two or more unequal widths are formed in a cell region;
    forming a gate oxide layer on the body regions and the substrate epitaxial layer, and forming a polycrystalline silicon dielectric layer on the gate oxide layer;
    etching the polycrystalline silicon dielectric layer and the gate oxide layer, and forming a gate with the polycrystalline silicon dielectric layers remained after etching;
    performing source region photoetching, and then injecting irons of the first doping type, so as to form two source regions in each of the body regions;
    depositing an insulation dielectric layer, etching the insulation dielectric layer to form contact holes, and then depositing a metal layer and etching the metal layer to form an electrode contact body of the source regions and an electrode contact body of the gate; and
    forming a drain region of the first doping type in the substrate epitaxial layer, and depositing a metal layer to form an electrode contact body of the drain region.

14. The manufacturing method of the semiconductor super-junction power device according to claim 13, wherein an interval with at least two unequal widths is set between adjacent pillar epitaxial doped regions.

15. The manufacturing method of the semiconductor super-junction power device according to claim 13, wherein the gate oxide layer is made from at least one of silicon oxide, silicon nitride, silicon oxynitride, hafnium oxide and other insulation materials with a high dielectric constant.

16. The manufacturing method of the semiconductor super-junction power device according to claim 13, wherein a gate resistor on the body regions and the substrate epitaxial layer is further formed when etching the polycrystalline silicon dielectric layer and forming the gate.

17. The manufacturing method of the semiconductor super-junction power device according to claim 13, wherein irons of the first doping type are injected at a low concentration in a self-aligning manner before the source region photoetching.

* * * * *